(12) United States Patent
Yang

(10) Patent No.: US 10,818,696 B2
(45) Date of Patent: Oct. 27, 2020

(54) DISPLAY PANEL AND FABRICATING METHOD THEREOF

(71) Applicant: Wuhan China Star Optoelectronics Semiconductor Display Technology Co., Ltd., Wuhan (CN)

(72) Inventor: Weiwei Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 6 days.

(21) Appl. No.: 16/332,359

(22) PCT Filed: Jan. 18, 2019

(86) PCT No.: PCT/CN2019/072316
§ 371 (c)(1),
(2) Date: Mar. 12, 2019

(87) PCT Pub. No.: WO2020/113794
PCT Pub. Date: Jun. 11, 2020

(65) Prior Publication Data
US 2020/0235135 A1 Jul. 23, 2020

(51) Int. Cl.
*H01L 27/12* (2006.01)
(52) U.S. Cl.
CPC ...... *H01L 27/1218* (2013.01); *H01L 27/1244* (2013.01); *H01L 27/1248* (2013.01); *H01L 27/1262* (2013.01)

(58) Field of Classification Search
CPC ............. H01L 27/1218; H01L 27/1244; H01L 27/1248; H01L 27/1262; H01L 27/283;
(Continued)

(56) References Cited

U.S. PATENT DOCUMENTS

2015/0287750 A1   10/2015   Youn et al.
2015/0348894 A1*  12/2015   Yan ................... H01L 21/76801
                                                        257/774
(Continued)

FOREIGN PATENT DOCUMENTS

CN        104183600        12/2014
CN        107658333         2/2018
(Continued)

*Primary Examiner* — Stephen W Smoot

(57) ABSTRACT

A display panel and a fabricating method thereof are provided. The display panel has a substrate, an active layer, an insulating layer, a first metal layer, an organic insulating layer, and a second metal layer. The display panel and the fabricating method thereof use an organic material as a dielectric insulating layer to reduce a problem that cracking is prone to occur when the display panel accumulates a large stress during bending. A minimum pore size of a through hole of the organic material is greater than that of an inorganic material, which is disadvantageous of a high-pixel-density display panel. Therefore, a first contact portion and a second contact portion of the first metal layer are electrically connected to the active layer, and a source electrode and a drain electrode of the second metal layer are electrically connected to the first/second contact portion respectively for the high-pixel-density display panel.

17 Claims, 6 Drawing Sheets

(58) Field of Classification Search
CPC . H01L 27/285; H01L 27/286; H01L 27/3258; H01L 27/3276; H01L 51/0097; H01L 51/5253; H01L 51/56
See application file for complete search history.

(56) References Cited

U.S. PATENT DOCUMENTS

| | | | | |
|---|---|---|---|---|
| 2017/0040347 | A1* | 2/2017 | Seo | H01L 51/5246 |
| 2017/0294425 | A1* | 10/2017 | Kim | H01L 51/0097 |
| 2018/0366586 | A1 | 12/2018 | Son et al. | |
| 2019/0131367 | A1 | 5/2019 | Kim et al. | |
| 2019/0131368 | A1 | 5/2019 | Zhang et al. | |
| 2019/0156708 | A1* | 5/2019 | Li | H01L 27/3276 |
| 2019/0259967 | A1* | 8/2019 | Yang | H01L 51/0023 |
| 2019/0287433 | A1* | 9/2019 | Huang | G09F 9/301 |
| 2019/0363145 | A1* | 11/2019 | Ohta | H01L 27/3246 |
| 2019/0386040 | A1* | 12/2019 | Wang | H01L 27/1218 |

FOREIGN PATENT DOCUMENTS

| | | |
|---|---|---|
| CN | 108573920 | 9/2018 |
| CN | 109148514 | 1/2019 |

* cited by examiner

DISPLAY PANEL AND FABRICATING METHOD THEREOF

RELATED APPLICATIONS

This application is a National Phase of PCT Patent Application No. PCT/CN2019/072316 having International filing date of Jan. 18, 2019, which claims the benefit of priority of Chinese Patent Application No. 201811465807.7 filed on Dec. 3, 2018. The contents of the above applications are all incorporated by reference as if fully set forth herein in their entirety.

FIELD AND BACKGROUND OF THE INVENTION

The present disclosure relates to a panel and a fabricating method thereof, and more particularly, to a display panel and a fabricating method thereof.

Organic light emitting diode (OLED) display devices have advantages of light weight, self-illumination, wide viewing angles, low driving voltage, low luminous efficiency, low power consumption, fast responses, and the like, and an application range is more and more extensive. Specifically, flexible organic light emitting diode display devices have characteristics of being bendable and easy to carry, and have become a main field of research and development in a field of display technology.

However, in a thin film transistor (TFT) of a current organic light emitting diode display device, an inorganic material is deposited as a dielectric insulating layer after forming a second gate layer. However, most inorganic materials tend to accumulate large stresses during bending and are prone to cracking.

As a result, it is necessary to provide a display panel and a fabricating method thereof to solve the problems existing in the conventional technologies.

SUMMARY OF THE INVENTION

From above, an object of an embodiment of the present disclosure is to provide a display panel and a fabricating method thereof, which can reduce a problem that cracking easily occurs when the display panel accumulates a large stress during bending. Furthermore, embodiments of the present disclosure are also applicable to high-pixel-density display panels.

To achieve the above object of the present disclosure, an embodiment of the present disclosure provides a display panel comprising an active area and a bending area, wherein the display panel comprises a substrate, an active layer, an insulating layer, a first metal layer, an organic insulating layer, and a second metal layer. The active layer is located within the active area and disposed on the substrate. The insulating layer is disposed on the active layer, wherein the insulating layer located within the bending area is provided with a first through hole, and the first through hole passes through the insulating layer. The first metal layer is disposed on the insulating layer and comprises a first metal wire located in the first through hole. The organic insulating layer is disposed on the first metal layer, wherein the organic insulating layer is provided with at least a second through hole, and a material of the organic insulating layer comprises polyimides. The second metal layer is disposed on the organic insulating layer and comprises a second metal wire disposed within the bending area, wherein the second metal wire is connected with the first metal wire through the at least a second through hole. The insulating layer is provided with two third through holes, and the first metal layer comprises a first contact portion and a second contact portion disposed within the active area, wherein the first contact portion and the second contact portion are electrically connected with the active layer through the two third through holes, respectively. The organic insulating layer comprises two fourth through holes, and the second metal layer comprises a source electrode and a drain electrode disposed within the active area, wherein the source electrode and the drain electrode are electrically connected with the first contact portion and the second contact portion through the two fourth through holes, respectively.

In an embodiment of the present disclosure, each of the at least a second through hole and the two fourth through holes has a pore size greater than or equal to 3.5 micrometers.

In an embodiment of the present disclosure, the display panel further comprises an oxide layer disposed on the substrate, wherein the first through hole passes through a part of the oxide layer.

In an embodiment of the present disclosure, the insulating layer comprises a first insulating layer and a second insulating layer, wherein the first insulating layer is disposed on the active layer, and the second insulating layer is disposed on the first insulating layer.

In an embodiment of the present disclosure, the display panel further comprises a gate electrode disposed between the first insulating layer and the second insulating layer.

Further, an embodiment of the present disclosure provides a display panel comprising an active area and a bending area, wherein the display panel comprises a substrate, an active layer, an insulating layer, a first metal layer, an organic insulating layer, and a second metal layer. The active layer is located within the active area and disposed on the substrate. The insulating layer is disposed on the active layer, wherein the insulating layer located within the bending area is provided with a first through hole, and the first through hole passes through the insulating layer. The first metal layer is disposed on the insulating layer and comprises a first metal wire located in the first through hole. The organic insulating layer is disposed on the first metal layer, wherein the organic insulating layer is provided with at least a second through hole. The second metal layer is disposed on the organic insulating layer and comprises a second metal wire disposed within the bending area, wherein the second metal wire is connected with the first metal wire through the at least a second through hole.

In an embodiment of the present disclosure, the insulating layer is provided with two third through holes, and the first metal layer comprises a first contact portion and a second contact portion disposed within the active area, wherein the first contact portion and the second contact portion are electrically connected with the active layer through the two third through holes, respectively. The organic insulating layer comprises two fourth through holes, and the second metal layer comprises a source electrode and a drain electrode disposed within the active area, wherein the source electrode and the drain electrode are electrically connected with the first contact portion and the second contact portion through the two fourth through holes, respectively.

In an embodiment of the present disclosure, each of the at least a second through hole and the two fourth through holes has a pore size greater than or equal to 3.5 micrometers.

In an embodiment of the present disclosure, a material of the organic insulating layer comprises polyimides.

In an embodiment of the present disclosure, the display panel further comprises an oxide layer disposed on the substrate, wherein the first through hole passes through a part of the oxide layer.

In an embodiment of the present disclosure, the insulating layer comprises a first insulating layer and a second insulating layer, wherein the first insulating layer is disposed on the active layer, and the second insulating layer is disposed on the first insulating layer.

In an embodiment of the present disclosure, the display panel further comprises a gate electrode disposed between the first insulating layer and the second insulating layer.

Further, another embodiment of the present disclosure provides a fabricating method of a display panel comprising an active area and a bending area, wherein the fabricating method of the display panel comprises steps of: providing a substrate; forming an active layer within the active area and disposing the active layer on the substrate; forming an insulating layer on the active layer, wherein the insulating layer located within the bending area is provided with a first through hole, and the first through hole passes through the insulating layer; forming a first metal layer on the insulating layer, wherein the first metal layer comprises a first metal wire located within the first through hole; forming an organic insulating layer on the first metal layer, wherein the organic insulating layer is provided with at least a second through hole; and forming a second metal layer on the organic insulating layer, wherein the second metal layer comprises a second metal wire disposed within the bending area, and the second metal wire is connected with the first metal wire through the at least a second through hole.

In an embodiment of the present disclosure, the insulating layer is provided with two third through holes, and the first metal layer comprises a first contact portion and a second contact portion disposed within the active area, wherein the first contact portion and the second contact portion are electrically connected with the active layer through the two third through holes, respectively; and wherein the organic insulating layer comprises two fourth through holes, and the second metal layer comprises a source electrode and a drain electrode disposed within the active area, wherein the source electrode and the drain electrode are electrically connected with the first contact portion and the second contact portion through the two fourth through holes, respectively.

In an embodiment of the present disclosure, each of the at least a second through hole and the two fourth through holes has a pore size greater than or equal to 3.5 micrometers.

In an embodiment of the present disclosure, a material of the organic insulating layer comprises polyimides.

In an embodiment of the present disclosure, the fabricating method of the display panel further comprises: forming an oxide layer on the substrate, wherein the first through hole passes through a part of the oxide layer.

The display panel and the fabricating method thereof in embodiments of the present disclosure use an organic material as a dielectric insulating layer to reduce a problem that cracking easily occurs when the display panel accumulates a large stress during bending. A minimum pore size of a through hole of the organic material is greater than that of an inorganic material, which is disadvantageous of the high-pixel-density display panel. Therefore, in the present disclosure, a first contact portion and a second contact portion of the first metal layer are electrically connected to the active layer, and a source electrode and a drain electrode of the second metal layer are electrically connected to the first contact portion and the second contact portion respectively for the high-pixel-density display panel.

To make the above description of the present disclosure more clearly comprehensible, it is described in detail below in examples of preferred embodiments with the accompanying drawings.

DESCRIPTION OF SPECIFIC EMBODIMENTS OF THE INVENTION

Following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, horizontal, vertical, longitudinal, axial, radial, an uppermost layer or a lowermost layer, etc., only refer to a direction of the accompanying figures. Therefore, the used directional terms are used to describe and understand the present disclosure, but the present disclosure is not limited thereto.

Figure 1:
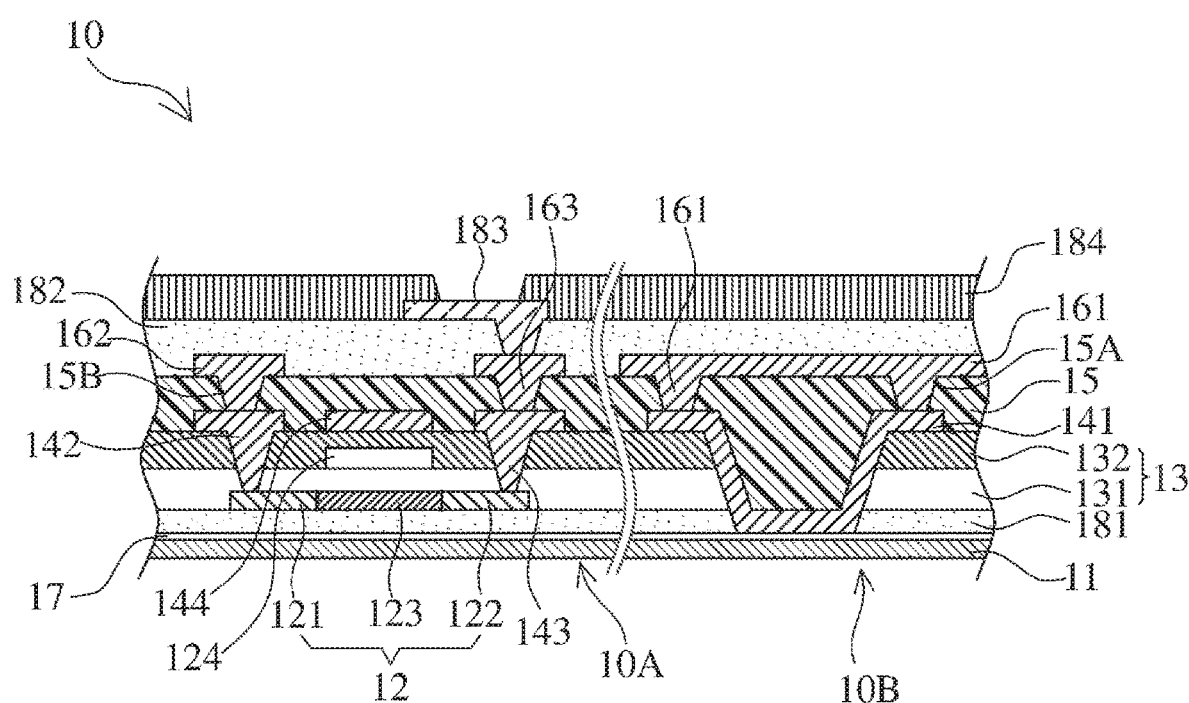
FIG. 1 is a cross-sectional schematic diagram of a display panel in an embodiment of the present disclosure.

Referring to FIG. 1, FIG. 1 is a cross-sectional schematic diagram of a display panel 10 in an embodiment of the present disclosure. The display panel 10 in an embodiment of the present disclosure includes a substrate 11, an active layer 12, an insulating layer 13, a first metal layer 14, an organic insulating layer 15, and a second metal layer 16. The display panel 10 can be defined with an active area 10A and a bending area 10B. The active area 10A is adjacent to the bending area 10B. In an embodiment, the substrate 11 is such as a base substrate, which can be used to support the active layer 12, the insulating layer 13, the first metal layer 14, the organic insulating layer 15, and the second metal layer 16. In an embodiment, the substrate 11 is such as a flexible substrate, a transparent substrate, or a flexible transparent substrate.

The active layer 12 is located within the active area 10A and disposed on the substrate 11. The active layer 12 can include a source electrode doping region 121 and a drain electrode doping region 122 formed by doping, and a channel region 123 disposed between the source electrode doping region 121 and the drain electrode doping region 122. The source electrode doping region 121, the drain electrode doping region 122, and the channel region 123 are located within the active area 10A.

The insulating layer 13 is disposed on the active layer 12, wherein the insulating layer 13 located within the bending area 10B is provided with a first through hole 13A, and the first through hole 13A passes through the insulating layer 13. In an embodiment, the first through hole 13A can be formed by, for example, photolithography etching. In an embodiment, the insulating layer 13 can further include at least two third through holes 13B located in the display area 10A. It is understood that only two third through holes 13B are shown in the drawings for convenience of description. In fact, a number of the third through holes 13B is greater than two.

The first metal layer 14 is disposed on the insulating layer 13 and comprises a first metal wire 141 located in the first through hole 13A. In an embodiment, the first metal layer 14 can further include a first contact portion 142 and a second contact portion 143 disposed in the active area 10A. The first contact portion 142 and the second contact portion 143 are electrically connected with the active layer 12 through the two third through holes 13B, respectively. In an embodiment, the first contact portion 142 has an inverted ladder structure. In another embodiment, the second contact portion 143 has an inverted ladder structure.

The organic insulating layer 15 is disposed on the first metal layer 14, wherein the organic insulating layer 15 is provided with at least a second through hole 15A. In an embodiment, material of the organic insulating layer 15 comprises polyimide. It is worth mentioning that the organic insulating layer 15 is mainly used as a dielectric insulating layer to avoid or block a direct electrical connection between respective patterns in the first metal layer 14. On the other hand, compared with inorganic materials, generally organic materials have high bending resistance, so a use of the organic insulating layer 15 as a dielectric insulating layer can reduce or avoid a problem that cracking is prone to occur when the display panel accumulates a large stress during bending. In an embodiment, the organic insulating layer 15 includes at least two fourth through holes 15B. It is understood that only two fourth through holes 15B are shown in the drawings for convenience of description. In fact, a number of the fourth through holes 15B is greater than two.

The second metal layer 16 is disposed on the organic insulating layer 15 and comprises a second metal wire 161 disposed within the bending area 10B, wherein the second metal wire 161 is connected with the first metal wire 141 through the at least a second through hole 15A. In an embodiment, the second metal layer 16 includes a source electrode 162 and a drain electrode 163 patterned within the active area 10A. The source electrode 162 and the drain electrode 163 are electrically connected with the corresponding first contact portion 142 and the second contact portion 143 through the two fourth through holes 15B, respectively. In an embodiment, the source electrode 162 has an inverted ladder structure. In an embodiment, a bottom area of the source electrode 162 is smaller than a top area of the first contact portion 142. In an embodiment, the drain electrode 163 has an inverted ladder structure. In an embodiment, a bottom area of the drain electrode 163 is smaller than a top area of the second contact portion 143. It should be mentioned here that a minimum pore size of a through hole of an inorganic material is about 2.5 micrometers, and a minimum pore size of a through hole of an organic material (for example, the second through hole and the fourth through hole 15B) is about 3.5 micrometers. However, for high-resolution display panels, through holes with a relatively high density are required, so if the source electrode doping region 121 and the drain electrode doping region 122 are directly electrically connected in a prior-art manner (using a single metal layer), it will be disadvantageous for the fabrication of a high-pixel-density display panel. Therefore, the display panel 10 in an embodiment of the present disclosure is lapped and connected by at least two metal layers. That is, the first contact portion 142 and the second contact portion 143 of the first metal layer 14 are electrically connected to the active layer 12. And the source electrode 162 and the drain electrode 163 of the second metal layer 16 are electrically connected with the first contact portion 142 and the second contact portion 143, respectively, thereby reducing a density of the through holes, so an embodiment of the present disclosure can be applied to the high-pixel-density display panel.

In an embodiment, the display panel 10 can further include an oxide layer 17 disposed on the substrate 11, wherein the first through hole 13A passes through a part of the oxide layer 11. In an example, a thickness of the etched thinner oxide layer is, for example, less than or equal to 100 nanometers.

In an embodiment, the insulating layer 13 includes a first insulating layer 131 and a second insulating layer 132, wherein the first insulating layer 131 is disposed on the active layer 12, and the second insulating layer 132 is disposed on the first insulating layer 131. In addition, a first gate electrode 124 can be disposed between the first insulating layer 131 and the second insulating layer 132, and the first gate electrode 124 can form a transistor structure with the active layer 12. The first metal layer 14 can further include a second gate 144 disposed above the first gate electrode 124, and the second gate electrode 144 can form a storage capacitor with the first gate electrode 124. In this embodiment, only one first gate electrode and one second gate electrode are illustrated. It can be understood that there is actually more than one, and the second gate electrode can be divided into two types according to functions, one type is to form a storage capacitor with the first gate electrode, and the other type is to connect with the channel region 123 to function as a bleeding voltage signal.

In an embodiment, the display panel 10 can further include a layered structure commonly used for display panels, such as a buffer layer 181, a flat layer 182, an anode layer 183, or a pixel defining layer 184. The buffer layer 181 is disposed between the substrate 11 and the active layer 12. The flat layer 182 is disposed on the organic insulating layer 15 and the second metal layer 16. The anode layer 183 is disposed on the flat layer 182. A portion of the anode layer 183, for example, passes through the drain 163 electrically connected to the second metal layer 16. It should be noted that the display panel 10 can also include other layered structures, such as a cathode layer (not shown), a color filter (not shown), and a light emitting layer (not shown). Materials or manufacturing methods of these layered structures can be referred to common materials or manufacturing methods in general display panel processes.

Referring to FIG. 2 and FIGS. 3A to 3G, FIG. 2 is a flowchart of a fabricating method 20 of a display panel in an embodiment of the present disclosure, and FIGS. 3A to 3G are cross-sectional schematic diagrams of a fabricating method 20 of the display panel in each of processes in an embodiment of the present disclosure. In the fabricating method 20 of the display panel in an embodiment of the present disclosure, the display panel includes an active area and a bending area. The fabricating method 20 includes steps 21 to 25 of: providing a substrate (step 21); forming an active layer within the active area and disposing the active layer on the substrate (step 22); forming an insulating layer on the active layer, wherein the insulating layer located within the bending area is provided with a first through hole, and the first through hole passes through the insulating layer (step 23); forming a first metal layer on the insulating layer, wherein the first metal layer comprises a first metal wire located within the first through hole (step 24); forming an organic insulating layer on the first metal layer, wherein the organic insulating layer is provided with at least a second through hole (step 25); and forming a second metal layer on the organic insulating layer, wherein the second metal layer comprises a second metal wire disposed within the bending area, and the second metal wire is connected with the first metal wire through the at least a second through hole (step 26).

Figure 2:
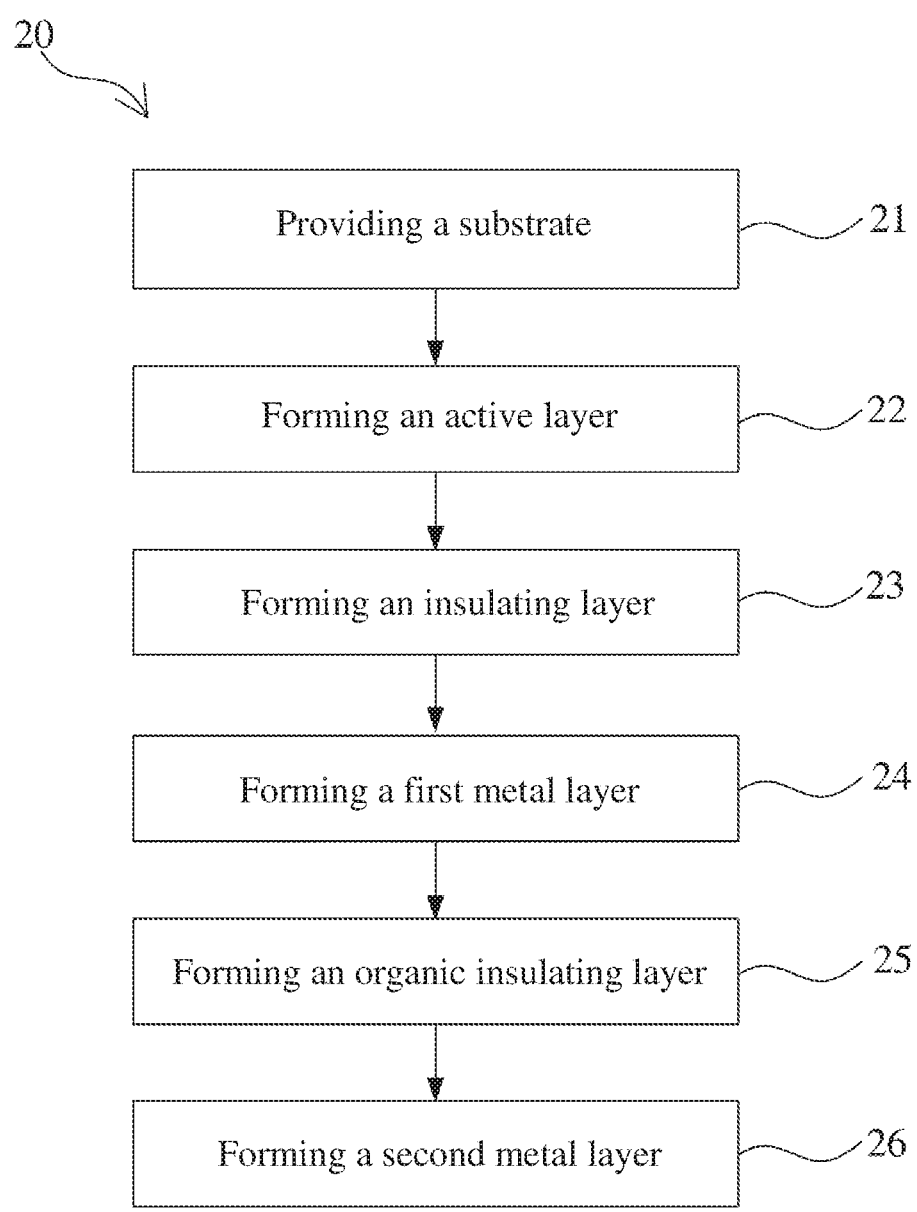
FIG. 2 is flowchart of a fabricating method of a display panel in an embodiment of the present disclosure.
Figure 3A:
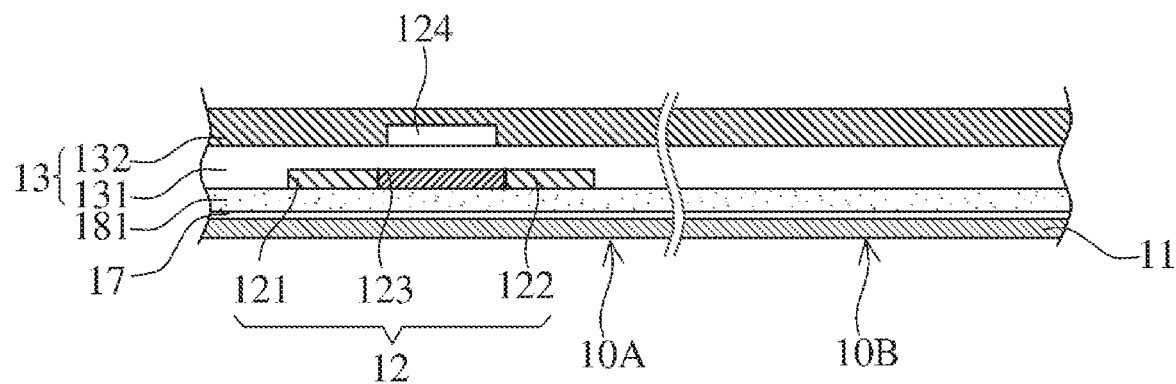
FIGS. 3A 3B, 3C, 3D, 3E, 3F and 3G are cross-sectional schematic diagrams of a fabricating method of a display panel in each of processes in an embodiment of the present disclosure.

Referring to FIGS. 2 and 3A. The fabricating method 20 of the display panel in an embodiment of the present disclosure includes step 21 of providing a substrate 11. In an embodiment, the substrate 11 is such as a flexible substrate, a transparent substrate, or a flexible transparent substrate. In another embodiment, an oxide layer 17 is formed on the substrate 11. In an example, a thickness of the oxide layer 17 is, for example, less than or equal to 100 nanometers.

Referring to FIGS. 2 and 3A. The fabricating method 20 of the display panel in an embodiment of the present disclosure includes step 22 of forming an active layer 12 within the active area 10A and disposing the active layer 12 on the substrate 11. The active layer 12 can include a source electrode doping region 121 and a drain electrode doping region 122 formed by doping. The source electrode doping region 121 and the drain electrode doping region 122 are located within the active area 10A. In an embodiment, a buffer layer 181 can also be formed between the substrate 11 and the active layer 12.

Referring to FIGS. 2 and 3A. The fabricating method 20 of the display panel in an embodiment of the present disclosure includes step 23 of forming an insulating layer 13 on the active layer 12, wherein the insulating layer 13 located within the bending area 10B is provided with a first through hole 13A, and the first through hole 13A passes through the insulating layer 13. In an embodiment, the first through hole 13A can be formed by, for example, photolithography etching. In an embodiment, the insulating layer 13 can further include at least two third through holes 13B located in the display area 10A. It is understood that only two third through holes 13B are shown in the drawings for convenience of description. In fact, a number of the third through holes 13B is greater than two.

Figure 3B:
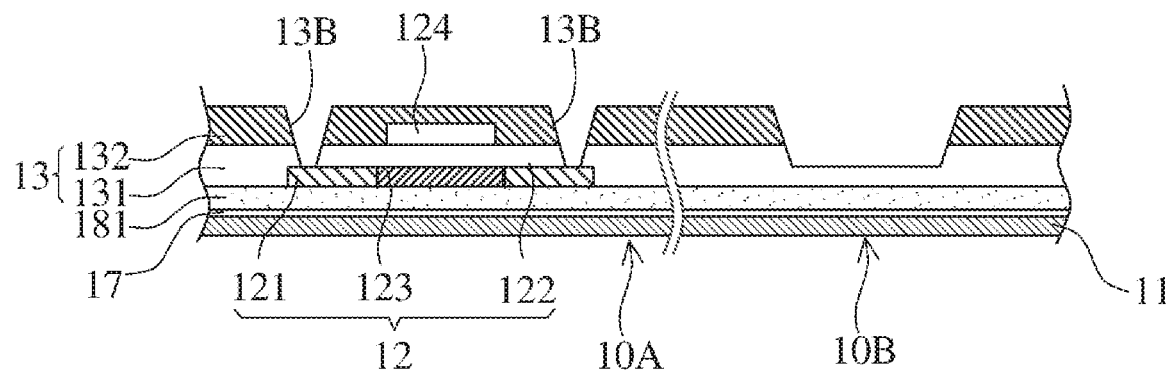
Figure 3C:
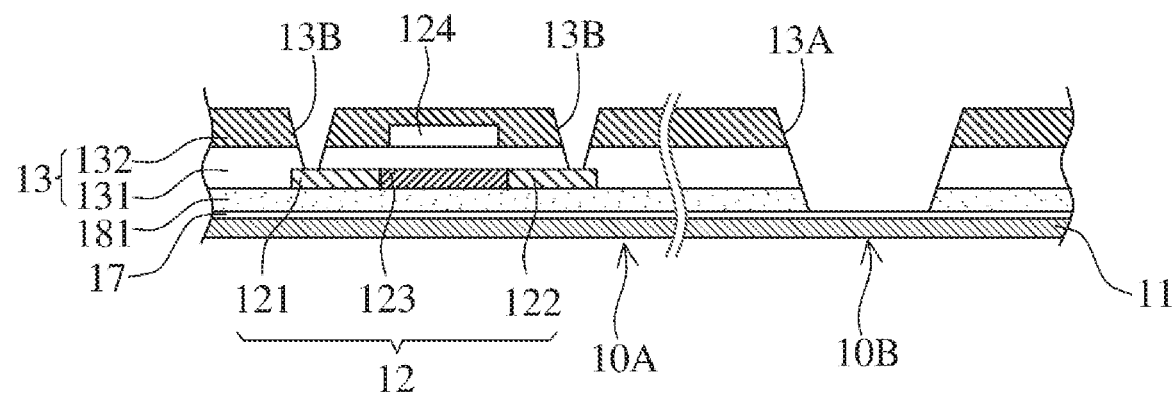
Figure 3D:
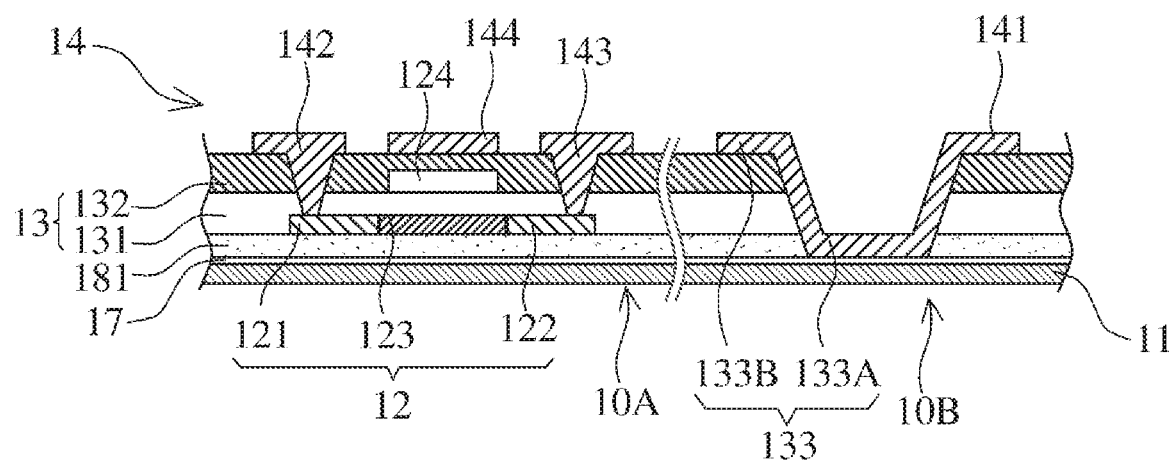

Referring FIG. 2 and FIGS. 3B to 3D. The fabricating method 20 of the display panel in an embodiment of the present disclosure includes step 24 of forming a first metal layer 14 on the insulating layer 13, wherein the first metal layer 14 comprises a first metal wire 141 located within the first through hole 13A. In an embodiment, the source electrode doping region 121, the drain electrode doping region 122, and the substrate 11 located within the bending area 10B can be exposed, for example, by two etching steps, such that the first metal layer 14 can be formed at one time, for example, by deposition. In a specific example, a first etching step mainly exposes the source electrode doping region 121 and the drain electrode doping region 122, and etches a portion of the insulating layer 13 located within the bending area 10B (as shown in FIG. 3B). Thereafter, a second etching step is to etch a remaining portion of the insulating layer 13 located within the bending area 10B to expose the substrate 11 (as shown in FIG. 3C). In an embodiment, the oxide layer 17 on the substrate 11 can also be etched.

In an embodiment, the first metal layer 14 can further include a first contact portion 142 and a second contact portion 143 disposed in the active area 10A. The first contact portion 142 and the second contact portion 143 are electrically connected with the active layer 12 through the two third through holes 13B, respectively. In an embodiment, the first contact portion 142 has an inverted ladder structure. In another embodiment, the second contact portion 143 has an inverted ladder structure.

Figure 3E:
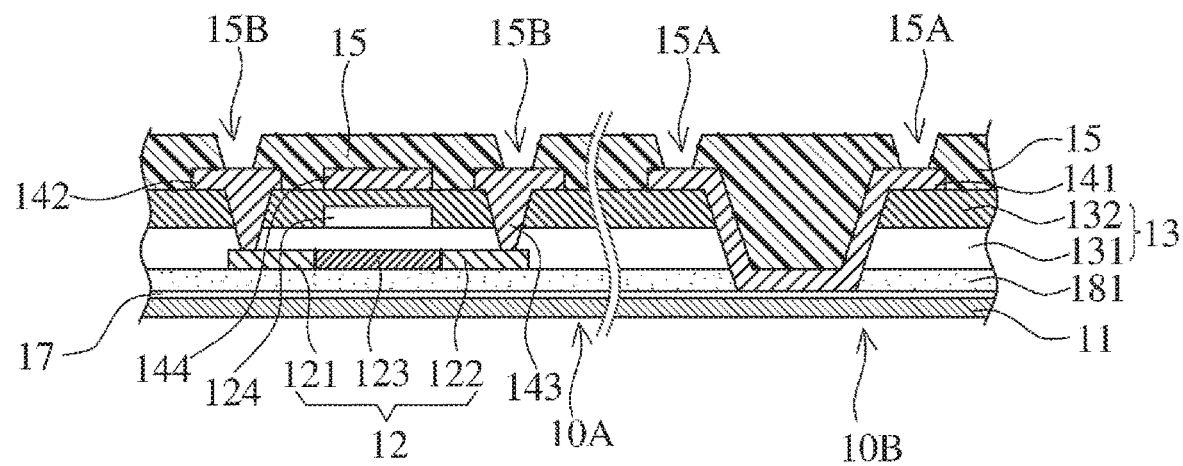

Referring to FIGS. 2 and 3E. The fabricating method 20 of the display panel in an embodiment of the present disclosure includes step 25 of forming an organic insulating layer 15 on the first metal layer 14, wherein the organic insulating layer 15 located within the bending area 10B is provided with at least a second through hole 15A. In an embodiment, material of the organic insulating layer 15 comprises polyimide. In another embodiment, the step of forming the organic insulating layer 15 includes steps of: forming an organic material layer on the first metal layer 14; and performing a lithography etching step on the organic material layer to form the organic insulating layer 15 with at least one second through hole 15A. In an embodiment, the organic insulating layer 15 can further include at least two fourth through holes 15B located within the active area 10A. It can be understood that, for convenience of explanation, only two fourth through holes 15B are shown in the drawing, and in fact, a number of the fourth through holes 15B is greater than two. In one embodiment, each of the at least one second through hole 15A and the two fourth through holes 15B has a pore size, and the pore size is greater than or equal to 3.5 micrometers. In other words, the organic insulating layer 15 can be completed at one time by patterning an organic material layer.

Figure 3F:
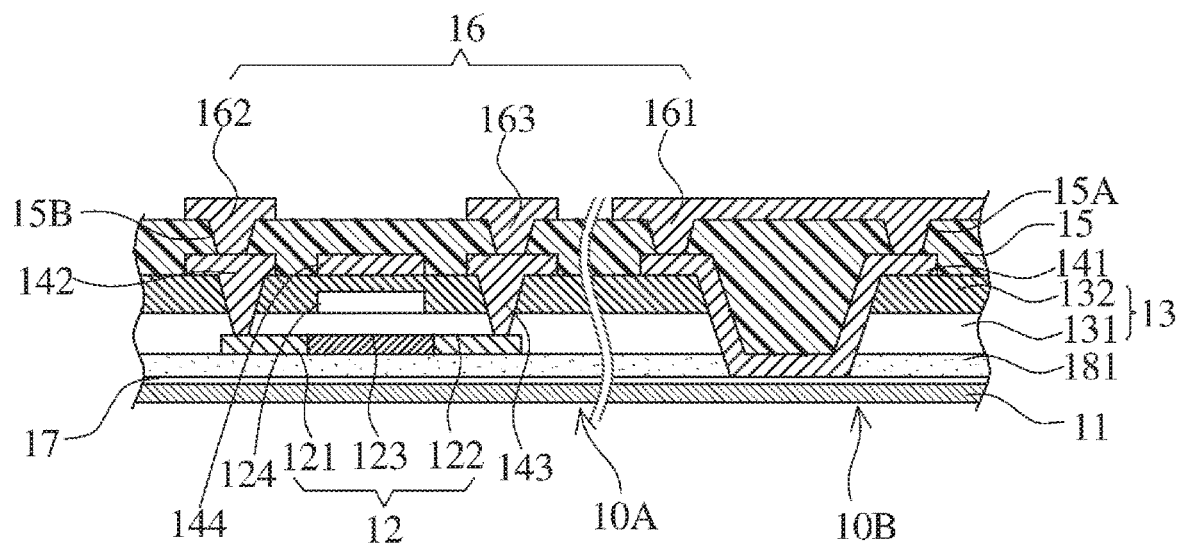

Referring to FIGS. 2 and 3F. The fabricating method 20 of the display panel in an embodiment of the present disclosure includes step 26 of forming a second metal layer 16 on the organic insulating layer 15, wherein the second metal layer 16 comprises a second metal wire 161 disposed within the bending area 10B, and the second metal wire 161 is connected with the first metal wire 141 through the at least a second through hole 15A. In an embodiment, the second metal layer 16 includes a source electrode 162 and a drain electrode 163 patterned within the active area 10A. The source electrode 162 and the drain electrode 163 are electrically connected with the corresponding first contact portion 142 and the second contact portion 143 through the two fourth through holes 15B, respectively. In an embodiment, the source electrode 162 has an inverted ladder structure. In an embodiment, a bottom area of the source electrode 162 is smaller than a top area of the first contact portion 142. In an embodiment, the drain electrode 163 has an inverted ladder structure. In an embodiment, a bottom area of the drain electrode 163 is smaller than a top area of the second contact portion 143.

In an embodiment, the step of forming the second metal layer 16 includes steps of: forming a metal material layer on the insulating layer 13 and in the at least one second through hole 15A and in the two fourth through holes 15B; and patterning the electrical material layer to form the second metal wire 161, the source electrode 162, and the drain electrode 163 of the second metal layer 16. In other words, the second electrical pattern layer 15 can be completed at one time by patterning the electrical material layer.

Figure 3G:
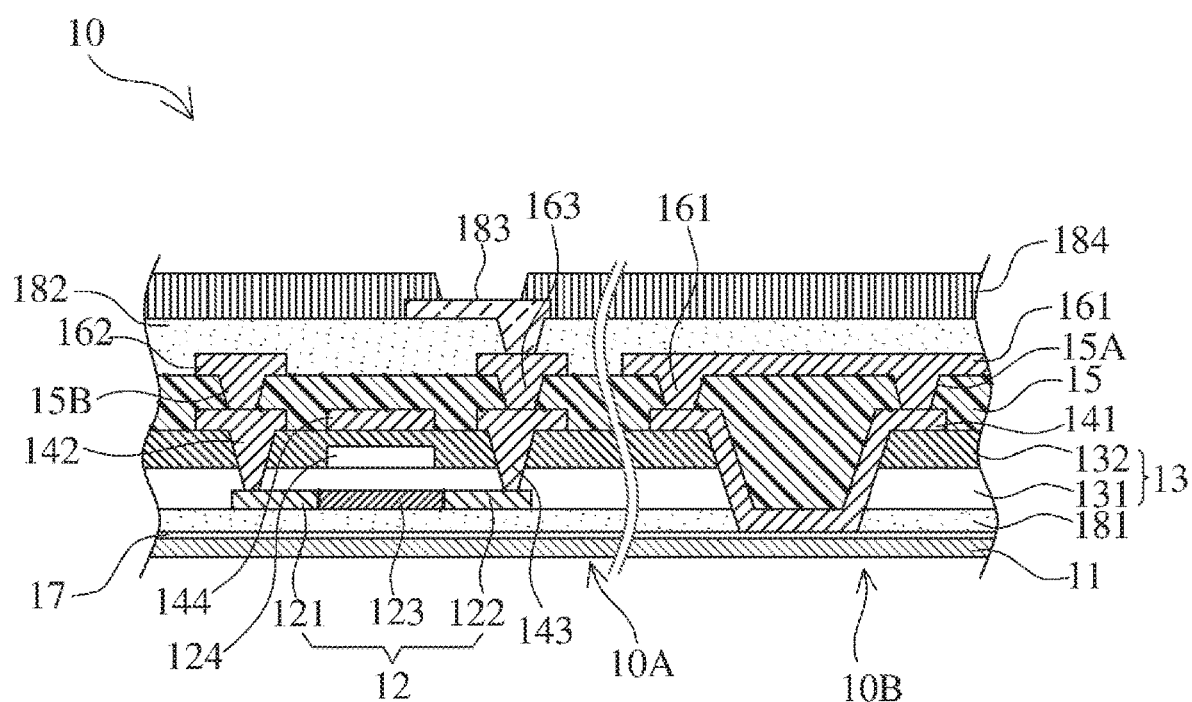

Referring to FIG. 2 and FIG. 3G. After the step 26 of forming the second metal layer 16, a layered structure, which is commonly used for display panels, such as a flat layer 182, an anode layer 183, or a pixel defining layer 184, can also be formed. In another embodiment, the display panel 10 can further include other layered structures, such as a cathode layer (not shown), a color filter (not shown), and a light emitting layer (not shown). Because these layered structures have been described in the preceding paragraphs, the description will not be repeated here.

It is noted that, compared with inorganic materials, generally organic materials have high bending resistance, so the fabricating method 20 of the display panel in an embodiment of the present disclosure uses the organic insulating layer 15 as a dielectric insulating layer so as to reduce or avoid a problem that cracking is prone to occur when the display panel accumulates a large stress during bending. In another aspect, in general, a minimum pore size of a through hole of the inorganic material is about 2.5 micrometers, and a minimum pore size of a through hole of the organic material (for example, the second through hole 15A and the fourth through hole 15B) is about 3.5 micrometers. However, for high-resolution display panels, through holes with a relatively high density are required, so if the source electrode doping region 121 and the drain electrode doping region 122 are directly electrically connected in a prior-art manner (using a single metal layer), it will be disadvantageous for the fabrication of a high-pixel-density display panel. Therefore, the display panel 10 in an embodiment of the present disclosure is lapped and connected by at least two metal layers. That is, the first contact portion 142 and the second contact portion 143 of the first metal layer 14 are electrically connected to the active layer 12. And the source electrode 162 and the drain electrode 163 of the second metal layer 16 are electrically connected with the first contact portion 142 and the second contact portion 143, respectively, thereby reducing a density of the through holes, so an embodiment of the present disclosure can be applied to the high-pixel-density display panel.

In an embodiment, the first contact portion 142 and the source electrode 162 have, for example, bottom surfaces of substantially the same size and top surfaces of substantially the same size, wherein the area of the bottom surfaces is smaller than the area of the top surfaces. In another embodiment, the second contact portion 143 and the drain electrode 163 have, for example, bottom surfaces of substantially the same size and top surfaces of substantially the same size, wherein the area of the bottom surfaces is smaller than the area of the top surfaces.

From above, the display panel and the fabricating method thereof in an embodiment of the present disclosure use an organic material as the dielectric insulating layer to reduce a problem that cracking is prone to occur when the display panel accumulates a large stress during bending. A minimum pore size of a through hole of the organic material is greater than that of an inorganic material, which is disadvantageous of the high-pixel-density display panel. Therefore, in the present disclosure, the first contact portion and the second contact portion of the first metal layer are electrically connected to the active layer, and the source electrode and the drain electrode of the second metal layer are electrically connected to the first/second contact portion respectively for the high-pixel-density display panel.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

The invention claimed is:

1. A display panel, comprising an active area and a bending area, wherein the display panel comprises:
a substrate;
an active layer located within the active area and disposed on the substrate;
an insulating layer disposed on the active layer and located on the bending area of the substrate, wherein the insulating layer located on the bending area of the substrate is provided with a first through hole, and the first through hole passes through the insulating layer;
a first metal layer disposed on the insulating layer and comprising a first metal wire located in the first through hole;
an organic insulating layer disposed on the first metal layer, wherein the organic insulating layer is provided with at least a second through hole, and material of the organic insulating layer comprises polyimide; and
a second metal layer disposed on the organic insulating layer and comprising a second metal wire disposed within the bending area, wherein the second metal wire is connected with the first metal wire through the at least a second through hole,
wherein the insulating layer is provided with two third through holes, and the first metal layer comprises a first contact portion and a second contact portion disposed within the active area, wherein the first contact portion and the second contact portion are electrically connected with the active layer through the two third through holes, respectively; and
wherein the organic insulating layer comprises two fourth through holes, and the second metal layer comprises a source electrode and a drain electrode disposed within the active area, wherein the source electrode and the drain electrode are electrically connected with the first contact portion and the second contact portion through the two fourth through holes, respectively.

2. The display panel according to claim 1, wherein each of the at least a second through hole and the two fourth through holes have a pore size greater than or equal to 3.5 micrometers.

3. The display panel according to claim 1, comprising an oxide layer disposed on the substrate, wherein the first through hole passes through a part of the oxide layer.

4. The display panel according to claim 1, wherein the insulating layer comprises a first insulating layer and a second insulating layer, wherein the first insulating layer is disposed on the active layer, and the second insulating layer is disposed on the first insulating layer.

5. The display panel according to claim 4, further comprising a gate electrode disposed between the first insulating layer and the second insulating layer.

6. A display panel, comprising an active area and a bending area, wherein the display panel comprises:
a substrate;
an active layer located within the active area and disposed on the substrate;
an insulating layer disposed on the active layer and located on the bending area of the substrate, wherein the insulating layer located on the bending area of the substrate is provided with a first through hole, and the first through hole passes through the insulating layer;
a first metal layer disposed on the insulating layer and comprising a first metal wire located in the first through hole;
an organic insulating layer disposed on the first metal layer, wherein the organic insulating layer is provided with at least a second through hole; and
a second metal layer disposed on the organic insulating layer and comprising a second metal wire disposed within the bending area, wherein the second metal wire is connected with the first metal wire through the at least a second through hole.

7. The display panel according to claim 6, wherein the insulating layer is provided with two third through holes, and the first metal layer comprises a first contact portion and a second contact portion disposed within the active area, wherein the first contact portion and the second contact portion are electrically connected with the active layer through the two third through holes, respectively; and wherein the organic insulating layer comprises two fourth through holes, and the second metal layer comprises a source electrode and a drain electrode disposed within the active area, wherein the source electrode and the drain electrode are electrically connected with the first contact portion and the second contact portion through the two fourth through holes, respectively.

8. The display panel according to claim 7, wherein each of the at least a second through hole and the two fourth through holes have a pore size greater than or equal to 3.5 micrometers.

9. The display panel according to claim 6, wherein material of the organic insulating layer comprises polyimide.

10. The display panel according to claim 6, comprising an oxide layer disposed on the substrate, wherein the first through hole passes through a part of the oxide layer.

11. The display panel according to claim 6, wherein the insulating layer comprises a first insulating layer and a second insulating layer, wherein the first insulating layer is disposed on the active layer, and the second insulating layer is disposed on the first insulating layer.

12. The display panel according to claim 11, further comprising a gate electrode disposed between the first insulating layer and the second insulating layer.

13. A fabricating method of a display panel, comprising an active area and a bending area, wherein the fabricating method of the display panel comprises steps of:

providing a substrate;

forming an active layer within the active area and disposing the active layer on the substrate;

forming an insulating layer on the active layer and on the bending area of the substrate, wherein the insulating layer located on the bending area of the substrate is provided with a first through hole, and the first through hole passes through the insulating layer;

forming a first metal layer on the insulating layer, wherein the first metal layer comprises a first metal wire located within the first through hole;

forming an organic insulating layer on the first metal layer, wherein the organic insulating layer is provided with at least a second through hole; and forming a second metal layer on the organic insulating layer, wherein the second metal layer comprises a second metal wire disposed within the bending area, and the second metal wire is connected with the first metal wire through the at least a second through hole.

14. The fabricating method of the display panel according to claim 13, wherein the insulating layer is provided with two third through holes, and the first metal layer comprises a first contact portion and a second contact portion disposed within the active area, wherein the first contact portion and the second contact portion are electrically connected with the active layer through the two third through holes, respectively; and wherein the organic insulating layer comprises two fourth through holes, and the second metal layer comprises a source electrode and a drain electrode disposed within the active area, wherein the source electrode and the drain electrode are electrically connected with the first contact portion and the second contact portion through the two fourth through holes, respectively.

15. The fabricating method of the display panel according to claim 14, wherein each of the at least a second through hole and the two fourth through holes have a pore size greater than or equal to 3.5 micrometers.

16. The fabricating method of the display panel according to claim 13, wherein material of the organic insulating layer comprises polyimide.

17. The fabricating method of the display panel according to claim 13, further comprising: forming an oxide layer on the substrate, wherein the first through hole passes through a part of the oxide layer.

* * * * *

UNITED STATES PATENT AND TRADEMARK OFFICE
CERTIFICATE OF CORRECTION

PATENT NO. : 10,818,696 B2
APPLICATION NO. : 16/332359
DATED : October 27, 2020
INVENTOR(S) : Weiwei Yang Page 1 of 1

It is certified that error appears in the above-identified patent and that said Letters Patent is hereby corrected as shown below:

On the Title Page

Insert the following:
-- (30) Foreign Application Priority Data
Dec. 3, 2018 (CN) ............. 201811465807.7 --

Signed and Sealed this
Twelfth Day of January, 2021

Andrei Iancu
*Director of the United States Patent and Trademark Office*